US006312568B2

(12) United States Patent
Wilke et al.

(10) Patent No.: US 6,312,568 B2
(45) Date of Patent: *Nov. 6, 2001

(54) TWO-STEP AIN-PVD FOR IMPROVED FILM PROPERTIES

(75) Inventors: Ingo Wilke, Unterschleissheim (DE); Rochelle King, Redwood City; Hoa Kieu, Sunnyvale, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/456,130

(22) Filed: Dec. 7, 1999

(51) Int. Cl.$^7$ .................................................. C23C 14/34

(52) U.S. Cl. .............................. 204/192.18; 204/192.15; 427/255.23

(58) Field of Search .................... 204/192.15, 192.18; 427/255.23

(56) References Cited

U.S. PATENT DOCUMENTS

| | | | |
|---|---|---|---|
| 4,842,891 | 6/1989 | Miyazaki et al. | 427/35 |
| 4,959,136 | * 9/1990 | Hatwar | 204/192.15 |
| 5,049,251 | 9/1991 | Inoue | 204/192.12 |
| 5,108,569 | 4/1992 | Gilboa et al. | 204/192.13 |
| 5,171,412 | 12/1992 | Talieh et al. | 204/192.15 |
| 5,178,739 | 1/1993 | Barnes et al. | 204/192.12 |
| 5,270,263 | * 12/1993 | Kim et al. | 437/228 |
| 5,431,799 | 7/1995 | Mosely et al. | 204/298.06 |
| 5,439,574 | 8/1995 | Kobayashi et al. | 204/192.12 |
| 5,639,357 | 6/1997 | Xu | 204/192.3 |
| 5,830,330 | 11/1998 | Lantsman | 204/192.12 |
| 5,985,103 | 11/1999 | Givens et al. | 204/192.12 |

OTHER PUBLICATIONS

Japanese patent 59–181678 abstract, Oct. 1984.*
McMahon R. "Voltage controlled, reactive planar magnetron sputtering of AlN thin films", J. Vac. Sci. Technol., 20(3), pp. 376–378, Mar.1982.*
U.S. Ser. No. 09/440679, Sundarrajon et al.
Ishihara et al., Control of Preferential Orientation of AlN Films Prepared by the Reactive Sputtering Method, Thin Solid Films, vol. 316, pp. 152–157 (1998).
Yong et al., Characteristics of Hydrogenated aluminum Nitride Films Prepared by Radio Frequency Reactive Sputtering and their Application to Surface Acoustic Wave Devices, Journal of Vacuum Science and Technology, vol. 15, No. 2, pp. 390–393 (Mar./Apr. 1997).
Giannelli et al., Surface Acoustic Wave Channel Waveguides by AlN Films, IEEE Ultrasonics Symposium, vol. 1, pp. 289–292 (1996).
Ivanov et al., Growth of Epitaxial AlN (0001) on Si(111) by Reactive Magnetron Sputter Deposition, Journal of Applied Physics, vol. 78, No. 9, pp. 5721–5726 (Nov.1995).
Liaw et al., The Characterization of Sputtered Polycrystalline Aluminum Nitride on Silicon by Surface Acoustic Wave Measurements, IEEE Transactions on Ultrasonics, Ferroelectrics, and Frequency Control, vol. 42, No. 3, pp. 404–409 (May 1995).
Odintzov et al., *AlN Films for SAW Sensors,* Sensors and Actuators A, vol. 28, No. 3, pp. 203–206 (1991).
Shiosaki, Piezoelectric Thin Films, Journal of The Ceramic Society of Japan, vol. 99, No. 1154, pp. 836–841 (Oct. 1991).
O'Connell et al., New Materials for Surface Acoustic Wave (SAW) Devices, Optical Engineering, vol. 16, No. 5, pp. 440–445 (Sep.–Oct. 1977).
National Technical Information Service, Aluminum Nitride for Surface Acoustic Waves, Technical Report AFM-L–TR–74–186 (Aug. 1974).

* cited by examiner

*Primary Examiner*—Nam Nguyen
*Assistant Examiner*—Steven H VerSteeg
(74) *Attorney, Agent, or Firm*—Thomason, Moser & Patterson, LLP

(57) ABSTRACT

The present invention provides a method of forming an aluminum nitride layer on a substrate in a processing chamber comprising depositing a first aluminum nitride layer at a first chamber pressure on a substrate, and then depositing a second aluminum nitride layer at a second chamber pressure higher than the first chamber pressure on the aluminum nitride nucleating layer. The first aluminum nitride layer is deposited by sputtering an aluminum target in a nitrogen and inert gas plasma in a processing chamber at a chamber pressure of about 1.5 to about 3 milliTorr. The second aluminum nitride layer is deposited by sputtering an aluminum target in a nitrogen and inert gas plasma at a chamber pressure of about 5 to about 10 milliTorr. The process may be carried out in the same physical vapor deposition chamber with the substrate being maintained at a temperature of preferably between about 125° C. and about 500° C. The advantages provided by the invention include an improved deposition rate for aluminum nitride with a preferred crystal orientation and improved layer properties.

19 Claims, 2 Drawing Sheets

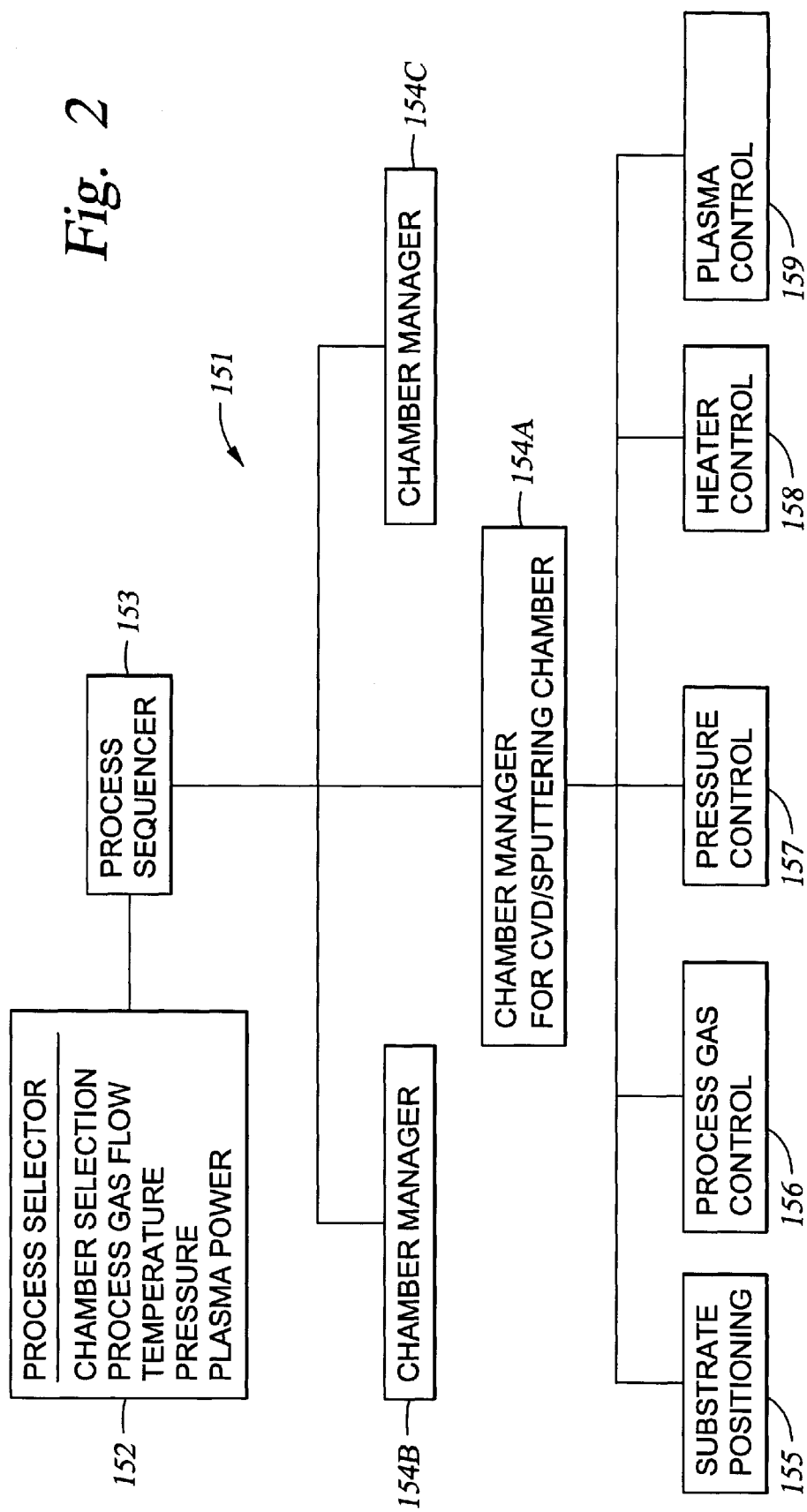

TWO-STEP AlN-PVD FOR IMPROVED FILM PROPERTIES

BACKGROUND OF THE INVENTION

1. Field of the Invention

The present invention relates to a metallization process for manufacturing semiconductor devices. More particularly, the invention relates to a method for depositing aluminum nitride films.

2. Background of the Related Art

Surface acoustic wave (SAW) and bulk acoustic wave (BAW) devices are circuit devices which conduct signal processing by converting electrical signals to acoustic waves, and from acoustic waves to electrical signals. The ability to transfer sound waves into electrical data, and electrical data into sound waves, have made SAW and BAW devices widely used as filters, resonators, delay lines, and other electric-acoustic devices in communications and related fields. In particular, SAW and BAW devices are highly desirable for use in the mobile radio communications field since the acoustic wave devices have a simple construction which provides effective radio filtration characteristics for use in mobile communication electronics. Recently, an increasing need has arisen for SAW and BAW devices to operate at higher frequencies to keep pace with the increasing demands for faster information transfer in the mobile radio communications field.

As an example, a SAW device is manufactured by forming electrodes of a conducting film, e.g., a metal, called inter-digital transducers (IDTs) on a piezoelectric substrate, with the electrodes interconverting the electronic signals and the surface acoustic waves. The characteristics of surface acoustic waves depend upon the propagation characteristics of the electrodes on the piezoelectric substrates. For acoustic wave devices to operate at higher frequencies, the piezoelectric substrates and the electrodes must have high propagation velocities for the acoustic waves.

Piezoelectric materials having desirable electromechanical properties, such as high propagation velocities, high frequency response, and high coupling coefficients, may be attained by using composites of thin piezoelectric films with materials used as bulk wave propagation media, surface wave propagation substrates and mechanical resonators. Therefore, one preferred method of achieving high frequency operations of acoustic wave devices is to deposit a high-speed acoustic wave propagation film on a piezoelectric film or substrate.

Aluminum nitride (AlN) films have been considered as an attractive piezoelectric material for fabrication of on-chip high frequency GHz-band acoustic wave devices (greater than 2 Ghz) because of aluminum nitride's attractive electromechanical properties which include a high propagation velocity of about 6000 m/s, a high coupling coefficient of about 0.07 which represents the efficiency of conversion of electrical energy to acoustic wave energy, good piezoelectricity properties, and high thermal stability. These electromechanical properties are dependent on the film's physical parameters which include the crystal structure, the crystal orientation, and the thickness of the film. By optimizing the film parameters, devices with desired electromechanical properties can be produced for specific uses in SAW applications. Therefore, significant effort has been undertaken to produce aluminum nitride films of high crystalline quality, preferred grain orientation (often referred to as crystal orientation), and uniform thickness for use in SAW applications, and in particular, for use in the fabrication of on-chip acoustic wave devices for integrated circuits.

Conventionally, thin aluminum nitride (AlN) films are deposited by chemical vapor deposition (CVD) and molecular beam epitaxy (MBE) techniques. While these AlN films showed very promising acoustic wave properties when evaluated by surface acoustic wave techniques, these deposition methods for AlN films typically require a high substrate temperature in excess of 1000° C. This high deposition temperature is not compatible with current semiconductor integrated circuit manufacturing methods for the fabrication of on-chip acoustic wave devices.

One alternative technique for depositing AlN films at temperatures lower than 500° C. is to deposit the AlN film by a PVD sputtering method. However, aluminum nitride layers deposited by PVD methods tend to produce layers having random crystal orientations. The aluminum nitride crystal structure which forms randomly on a substrate produces polycrystalline films without a preferred grain orientation. A random crystal orientation leads to a degradation in conversion between electronic signals and surface acoustic waves by producing films having low coupling coefficients, and impaired acoustic propagation velocities with higher propagation losses. Thus, the orientation of the crystal in a polycrystalline film is a key material parameter affecting the SAW and BAW characteristics of deposited films, and the crystal orientation formation in the AlN film is important to the formation of a film having superior acoustic properties.

Thin film deposition processes typically begin with the deposition of isolated nucleation sites. In a PVD deposition, these sites are created when individual sputtered portions of the target hit the substrate, followed by other such portions depositing on the substrate. In a CVD deposition, the nucleation sites occur where the precursor deposits on the substrate. It is believed that the difference in the growth rates of the nucleation sites determines the film's orientation. In particular, it is believed that films deposited by PVD sputtering produce polycrystalline films originating and growing from random nucleation sites. Nucleation sites having crystal orientations which exhibit fast growth rates, such as those with a growth direction normal to the substrate surface will emerge as predominant over sites having orientations exhibiting slower growth rates. The resulting film structure from the PVD sputtering process has multiple grains of varying sizes and multiple crystal orientations.

One proposed method of producing an aluminum nitride film by PVD with a preferred degree of crystal orientation is disclosed in Ishihara et al., "Control of Preferential Orientation of AlN Films Prepared by the Reactive Sputtering Method", Thin Solid Films 316, pp. 152–157 (1998). Ishihara et al. provide a sputtering process regime for depositing aluminum nitride films having a preferred crystal orientation. However, the Ishihara et al. process produces films that are highly stressed and have non-uniform film thickness. The high film stress produces layering defects in the film that have a detrimental affect on the electromechanical properties of the aluminum nitride films. Further, since the transmission frequency and frequency response of a SAW device is very dependent on the uniform thickness of a film, non-uniform films provide variable and inconsistent SAW performance. Additionally, the Ishihara et al, process suffers from low deposition rates of less than 200 angstroms per minute in comparison to commercially acceptable deposition rates of about 1000 angstroms per minute or greater, thereby limiting the commercial application of the process.

Therefore, there remains a need for a method for depositing aluminum nitride films that provides a preferred crystal orientation and improved film properties with high deposition rates.

SUMMARY OF THE INVENTION

The present invention generally provides a two step process for forming an aluminum nitride layer on a substrate using physical vapor deposition techniques. In one aspect of the invention, the deposition process comprises depositing a first aluminum nitride layer at a first chamber pressure, preferably between about 1.5 milliTorr and about 3.0 milliTorr, to provide a nucleation layer with a preferred degree of crystal orientation, and depositing a second aluminum nitride layer at a second chamber pressure higher than the first chamber pressure, preferably between about 5 milliTorr and about 10 milliTorr. The first aluminum nitride layer is preferably deposited by sputtering an aluminum target in a nitrogen plasma containing trace amounts of an inert gas and the second aluminum nitride layer is deposited by sputtering an aluminum target in a nitrogen and inert gas plasma. Preferably, the first and second deposition steps are carried out in the same PVD chamber at a substrate temperature between about 125° C. and about 500° C.

In another aspect of the invention, an aluminum nitride film is deposited on a substrate in a processing chamber by introducing a first nitrating process gas into the processing chamber to produce a first chamber pressure, sputtering an aluminum target to deposit a first aluminum nitride layer, introducing a second nitrating process gas into the processing chamber to produce a second chamber pressure higher than the first chamber pressure, and sputtering an aluminum target to deposit a second aluminum nitride layer. The deposition process provides a preferred crystal orientation with improved film properties. The deposition process also provides a high rate of deposition for forming an aluminum nitride film.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 2 is a simplified block diagram showing the hierarchical control structure of a computer program suitable for controlling a process of the present invention.

DETAILED DESCRIPTION OF THE PREFERRED EMBODIMENT

Figure 1:
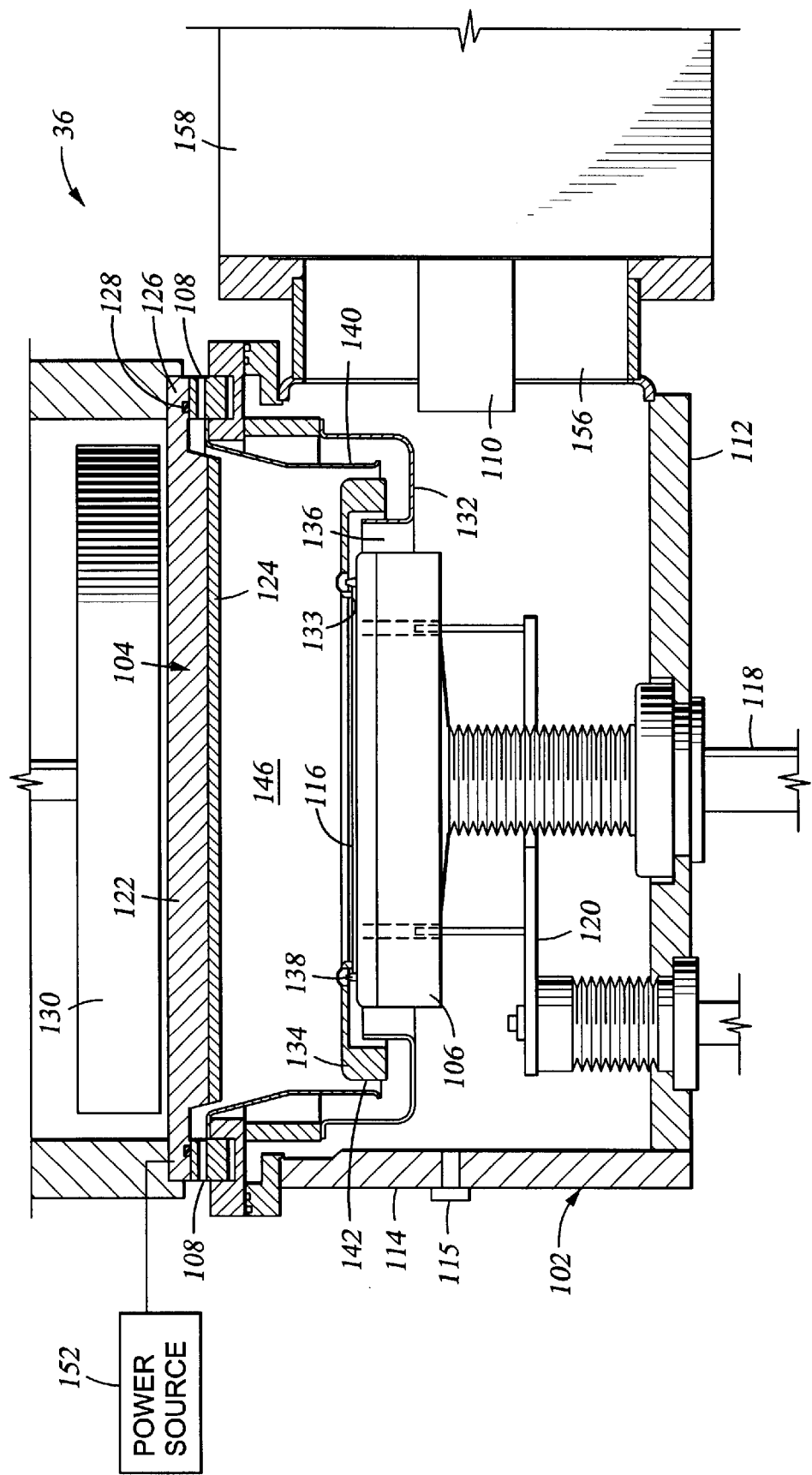
FIG. 1 is a schematic cross-sectional view of an PVD chamber suitable for performing the PVD processes of the present invention.

The present invention generally provides a two step process for depositing a piezoelectric film on a substrate. More particularly, the present invention provides a two step process for forming an aluminum nitride layer with improved film qualities, wherein the first aluminum nitride layer is deposited at a first chamber pressure and the second aluminum nitride layer is deposited at a second chamber pressure higher than the first chamber pressure. The two step deposition process comprises sputtering an aluminum target in a nitrating gas, preferably nitrogen, and an inert gas, preferably argon, plasma at a chamber pressure between about 1.5 milliTorr and about 3 milliTorr, followed by sputtering the aluminum target in a nitrating gas, preferably nitrogen, and an inert gas, preferably argon, plasma at a chamber pressure of between about 5 milliTorr and about 10 milliTorr. The two step process for depositing the film is preferably performed at a substrate temperature between about 125° C. and about 500° C. The present invention has the advantage of producing, at a high deposition rate, an aluminum nitride film having preferred degree of grain orientation with low film stress and improved thickness uniformity.

The Apparatus

The methods of the present invention may be performed using a PVD chamber commercially available from Applied Materials, Inc., of Santa Clara, Calif. The features of the PVD chamber are generally described below. It is to be understood that while the below described PVD chamber is known to the inventors, other chambers may also be used or modified to be used, to advantage to accomplish the methods of the present invention.

The PVD chamber 36 generally comprises a chamber enclosure 102, a target 104, a substrate support 106, a gas inlet 108 and a gas exhaust 110. The chamber enclosure 102 includes a chamber bottom 112 and a chamber side wall 114. A slit valve 115 is disposed on a chamber side wall 114 to facilitate transfer of a substrate 116 into and out of the PVD chamber 36. The substrate support 106 is disposed on a substrate support lift assembly 118 through the chamber bottom 112. Typically, a temperature control element (not shown), such as a heater, is incorporated within the substrate support 106 to control the temperature of the substrate 116 during processing. Preferably, the substrate support 106 is made of stainless steel, and the temperature control element comprises a platinum/rhodium heater coil. The substrate support lift assembly 118 moves the substrate support 106 vertically between a substrate transfer position and a substrate processing position. A lift pin assembly 120 lifts the substrate 116 off the substrate support 106 to facilitate transfer of the substrate 116 between the chamber and a robot blade (not shown) used to transfer the substrate into and out of the chamber.

The target 104 is disposed in the top portion of the chamber enclosure 102. Preferably, the target 104 is positioned directly above the substrate support 106. The target 104 generally comprises a backing plate 122 supporting a plate of sputterable material 124. Typical target materials for aluminum nitride films are aluminum for use with the reactive sputtering process described herein. The backing plate 122 includes a flange portion 126 that is secured to the chamber enclosure 102. Preferably, a seal 128, such as an O-ring, is provided between the flange portion 126 of the backing plate 122 and the chamber enclosure 102 to establish and maintain a vacuum environment in the chamber during processing. A magnet assembly 130 is disposed above the backing plate 122 to provide magnetic field enhancement that increases the plasma density adjacent the target sputtering surface (by trapping electrons) to enhance sputtering of the target material.

A lower shield 132 is disposed in the chamber to shield the interior surfaces of the chamber enclosure 102 from deposition. The lower shield 132 extends from the upper portion of the chamber side wall 114 to a peripheral edge of the substrate support 106 in the processing position. A clamp ring 134 may be used and is removeably disposed on an inner terminus 136 of the lower shield 132. When the substrate support 106 moves into the processing position, the inner terminus 136 surrounds the substrate support 106, and a peripheral portion 138 of the substrate 116 engages an inner terminus 133 of the clamp ring 134 and lifts the clamp ring 134 off the inner terminus 136 of the lower shield 132. The clamp ring 134 serves to clamp or hold the substrate 116 as well as shield the peripheral portion 138 of the substrate 116 during the deposition process. Alternatively, instead of a clamp ring 134, a shield cover ring (not shown) is disposed above an inner terminus of the lower shield. When the substrate support moves into the processing position, the inner terminus of the shield cover ring is positioned immediately above the peripheral portion of the substrate to shield the peripheral portion of the substrate support 106 from deposition.

Preferably, an upper shield 140 is disposed within an upper portion of the lower shield 132 and extends from the upper portion of the chamber side wall 114 to a peripheral edge 142 of the clamp ring 134. Preferably, the upper shield 140 comprises a material that is similar to the materials that comprise the target, such as aluminum, titanium and other metals. The upper shield 140 is preferably a floating-ground upper shield that provides an increased ionization of the plasma compared to a grounded upper shield. The increased ionization provides more ions to impact the target 104 leading to a greater deposition rate because of the increased sputtering from the target 104. Alternatively, the upper shield 140 can be grounded during the deposition process.

A gas inlet 108 disposed in the chamber sidewall 114 of the chamber enclosure 102 introduces a processing gas into the chamber enclosure 102 and enters a process cavity 146 by flowing between the upper shield 140 and the lower shield 132. The process cavity 146 is defined by the target 104, the substrate 116 disposed on the substrate support 106 in the processing position and the upper shield 140. Typically, argon is introduced through the gas inlet 108 as the process gas source for the plasma. A gas exhaust 110 is disposed on the chamber side wall 114 to evacuate the chamber prior to the deposition process, as well as control the chamber pressure during the deposition process. Preferably, the gas exhaust 110 includes an exhaust valve 156 and an exhaust pump 158. The exhaust valve 156 controls the conductance between the interior of the chamber 36 and the exhaust pump 158.

To supply a bias to the target 104, a power source 152 is electrically connected to the target 104. The power source 152 may include a DC generator and a DC matching network coupled to the target 104. The power source 152 supplies the energy to the process cavity to strike and maintain a plasma of the processing gas in the process cavity during the deposition process.

A gas exhaust 110 is disposed on the chamber side wall 114 to evacuate the chamber prior to the deposition process, as well as control the chamber pressure during the deposition process. Preferably, the gas exhaust 110 includes an exhaust valve 156 and an exhaust pump 158. The exhaust valve 156 controls the conductance between the interior of the chamber 36 and the exhaust pump 158. The exhaust pump 158 preferably comprises a turbomolecular pump in conjunction with a cryopump to minimize the pump down time of the chamber. Alternatively, the exhaust pump 158 comprises a low pressure, a high pressure pump or a combination of low pressure and high pressure pumps.

Referring to FIG. 1, the sputtering process is performed in a processing zone or process cavity 146 located between the sputtering target 104, preferably composed of aluminum, and the substrate 116. The target 104 is electrically isolated from the chamber 36 and serves as a process electrode for generating a sputtering plasma. During the sputtering process, a sputtering gas, typically a noble gas such as argon or xenon, is introduced into the process cavity 146 of the chamber 36. Then, power is supplied to the sputtering target 104, with the target at a negative voltage, to form an electric field within the chamber 36, with the chamber walls, and if desired, the substrate support 106 disposed in the chamber 36 being electrically grounded. The resultant electric field in the chamber 36 ionizes the sputtering gas to form a sputtering plasma that sputters the target 104 causing deposition of material on the substrate. In the sputtering processes, the plasma is typically generated by applying a DC or RF voltage at a power level to the sputtering target of from about 100 to about 20,000 Watts, and more typically from about 100 to 10,000 Watts, and more preferably between about 4000 and about 7000 watts.

Control Systems

Referring to FIG. 2, the processes of the present invention can be implemented using a computer program product 161 that runs on a conventional computer system comprising a central processor unit (CPU) interconnected to a memory system with peripheral control components, such as for example a 68400 microprocessor, commercially available from Synenergy Microsystems, Calif. The computer program code can be written in any conventional computer readable programming language such as for example 68000 assembly language, C, C++, Java, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 2 shows an illustrative block diagram of the hierarchical control structure of the computer program 161. A user enters a process set number and process chamber number into a process selector subroutine 162 in response to menus or screens displayed on the CRT monitor by using the light pen interface. Tile process sets are predetermined sets of process parameters necessary to carry out specified processes, and are identified by predefined set numbers. Process selector subroutine 162 identifies (i) the identified process chamber, or the desired process chamber if a multi-chamber system is used, and (ii) the desired set of process parameters needed to operate the process chamber for performing the desired process. The process parameters for performing a specific process relate to process conditions such as, for example, process gas composition and flow rates, temperature, chamber pressure, plasma conditions such as DC power levels, and chamber dome temperature, and are provided to the user in the form of a recipe. The parameters specified by the recipe are entered utilizing a light pen/CRT monitor interface (not shown).

A process sequencer subroutine 163 comprises program code for accepting the identified process chamber and set of process parameters from the process selector subroutine 162, and for controlling operation of the various process chambers. Multiple users can enter process set numbers and process chamber numbers, or a user can enter multiple process set numbers and process chamber numbers, so the sequencer subroutine 163 operates to schedule the selected processes in the desired sequence. Preferably the sequencer subroutine 163 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 163 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 163 determines which process chamber and process set combination is going to be executed next, sequencer subroutine 163 causes execution of the process set by passing the particular process set parameters to a chamber manager subroutine 164A–C, which controls multiple processing tasks in PVD chamber 36 and possibly other chambers (not shown) according to tile process set determined by sequencer subroutine 163.

Once the sequencer subroutine 163 determines which process chamber and process set combination is going to be executed next, the sequencer subroutine 163 causes execution of the process set by passing the particular process set parameters to the chamber manager subroutines 164A–C which control multiple processing tasks in different process chambers according to the process set determined by the sequencer subroutine 163. For example, the chamber manager subroutine 164A comprises program code for controlling PVD process operations, within the described process chamber 36 of FIG. 1.

The chamber manager subroutine 164 also controls execution of various chamber component subroutines or program code modules, which control operation of the chamber components necessary to carry out the selected process set. Examples of chamber component subroutines are substrate positioning subroutine 165, process gas control subroutine 166, chamber pressure control subroutine 167, heater control subroutine 168, and plasma control subroutine 169. Those having ordinary skill in the art will recognize that other chamber control subroutines can be included depending on what processes are desired to be performed in chamber 36 (shown in FIG. 1). In operation, chamber manager subroutine 164A selectively schedules or calls the process component subroutines in accordance with the particular process set being executed. Scheduling by chamber manager subroutine 164A is performed in a manner similar to that used by sequencer subroutine 163 in scheduling which process chamber and process set to execute. Typically, chamber manager subroutine 164A includes steps of monitoring the various chamber components, determining which components need to be operated based on the process parameters for the process set to be executed, and causing execution of a chamber component subroutine responsive to the monitoring and determining steps.

The Deposition Process

The present invention will now be described with reference to a preferred process sequence practiced using the above described processing system. For use in piezoelectric films, a hexagonal crystal orientation (0002), often referred to as a (001) cubic crystal orientation, of aluminum nitride is preferably grown because the orientation provides a large electromechanical coupling coefficient and superior electromechanical properties over other aluminum nitride crystal orientations. Although aluminum nitride is difficult to grow in the (0002) crystal orientation by conventional PVD process regimes. The invention provides a novel two step deposition process is provided to deposit the aluminum nitride film having the (0002) crystal orientation at commercially preferable deposition rates of about 1000 Å/min or greater. The first aluminum nitride deposition step of the invention controls the degree of crystal orientation by promoting the growth of nucleation sites formed with the (0002) preferred crystal orientation. The second aluminum nitride deposition step of the invention decouples the deposition rate of the aluminum nitride films from the selection of the crystal orientation.

For the aluminum nitride deposition process, preferably the same physical vapor deposition (PVD) chamber is used for both steps of the process, where the substrate is preferably maintained at a temperature between about 125° C. and about 500° C. A substrate is introduced into a PVD chamber as describe above and which contains an aluminum target.

In the first aluminum nitride deposition step, a processing gas comprising a nitrating gas, such as nitrogen, and an inert gas, such as argon, is introduced into the PVD chamber for a period of time to produce a first chamber pressure of between about 1.5 milliTorr and about 3 milliTorr to deposit an aluminum nitride film having a (0002) orientation. Once the processing gas achieves the preferred chamber pressure, power of about 4000 watts (4 kW) to about 7000 watts (7 kW) is applied to the target and a plasma is struck. The processing gas plasma sputters the aluminum target to produce aluminum species which deposit with nitrogen directly onto the substrate or react with the nitrogen species contained in the plasma to form aluminum nitride which is then deposited on the substrate surface.

It is believed that the rate of formation of oriented nucleation sites, such as the preferred (0002) orientation, and the corresponding growth rates of the nucleation sites are controlled by the deposition rates of crystal growth units. In particular, the orientation and growth of nucleation sites are decided by the number of bonds lying under the growth unit. When the growth units are atoms such as Al and N, the preferred crystal orientation (0002) is developed and dominates over the other formed crystal orientations. When the growth units are dimers such as Al—N, crystal orientation other than the (0002) orientation are formed. The formation of atomic growth units and dimer growth units are affected by the interaction of the Al and N species during the deposition process. The more interaction between the Al and N species, the more likely dimer growth units will be formed. Therefore, by controlling the interaction between the Al and N species, a preferred degree of crystal orientation can be achieved.

A pressure regime of between about 1.5 milliTorr and about 3 milliTorr is preferably used to minimize the interaction of the Al and N species during sputtering, thereby enhancing the formation and growth of nucleation sites with an high degree of (0002) orientation. The deposited (0002) orientated film provides for a preferred crystal orientation for subsequently deposited aluminum nitride layers. However, the deposition of aluminum nitride at low chamber pressures provides for a low deposition rate, and the resulting highly orientated film exhibits high compressive stress and increased thickness non-uniformity. In order to minimize these undesirable film properties, the first aluminum nitride layer preferably comprises a thin film less than about 300 angstroms (Å) thick. However, depending on the application, a first aluminum nitride film with a greater thickness may be deposited.

In the second aluminum nitride deposition step, the chamber pressure is increased to between about 5 milliTorr and about 10 milliTorr. The processing gas of the second deposition step also comprises a nitrating gas, preferably nitrogen, and an inert gas, such as argon (Ar). Preferably, the increase pressure of the second deposition step is performed by increasing the flow rates of the inert gas and nitrogen containing gas. Once the preferred chamber pressure and processing gas flow rate is achieved, a plasma is struck by applying power of about 4 kW and about 7 kW to the target. The plasma of the processing gases sputters the aluminum target to produce aluminum species which react with the nitrogen species to form aluminum nitride which is subsequently deposited on the substrate surface. (AlN can also form on the target and on other surfaces of the chamber and substrate.) The second deposition step is performed at a higher chamber pressure which provides a faster deposition rate and produces a film having a low tensile stress instead of high compressive stress and improved film thickness uniformity.

A high deposition rate of the second deposition step can be achieved by producing a film without a preferred (0002) crystal orientation. It is believed that the interaction of the Al and N species can be increased to produce AlN dimers by allowing more time for the interaction to occur, such as by the use of a "long throw" PVD chamber, or by increasing the ability of the species to react. Preferably, a chamber pressure of between about 5 milliTorr and about 10 milliTorr is used to increase the ability of the nitrogen and aluminum species to react and form AlN dimers. A higher pressure deposition regime provides a greater amount of plasma and sputtering material, thereby resulting in higher deposition rates and faster crystal growth rates than individual Al and N species. Additionally, crystalline structures formed from dimer growth units are less likely than the crystalline structures formed with the atomic growth units of the (0002) crystal orientation to disassociate during the sputtering process, which allows higher deposition rates than in (0002) crystal orientation depositions.

In the two step deposition process, the first aluminum nitride layer imparts a preferred crystal orientation to the growing second aluminum nitride layer deposited during the second deposition step. The two step deposition process produces a film exhibiting the desired crystal orientation of the first layer with the high deposition rates and improved film properties of the second layer. Therefore, the present invention controls the chamber pressure of the deposition and thus the composition of the reactive species, and thereby controls the degree of crystal orientation of the films and the deposition rates that can be achieved.

In addition to the interaction of the plasma species to determine crystal orientation, it is believed that improved film properties may be influenced from the higher chamber pressure deposition scheme. A relatively high chamber pressure promotes a higher collision rate and dimer formation rate, where dimers are formed by converting the pre-collision kinetic energy of the Al and N species to bonding energy, thereby producing an Al—N species having lower amounts of post-collision kinetic energy. Since enegetic particle bombardment during deposition exhibit compressive stresses, the low kinetic energy of the dimer species depositing on the substrate form films with less compressive stress. These lower compressive stressed films have better adhesion to adjacent materials, such as the substrate, and suffer from fewer layering defects, such as film cracking and film discontinuities. Therefore, the deposition process of the present invention overcomes film stress by combining a thin layer of high stress material with a bulk deposition of material having low stress characteristics, thereby forming an aggregate aluminum nitride film with a lower overall stress.

Additionally, the higher collision rate and lower kinetic energy of the dimer species will also allow for a more even distribution of the species in the plasma, providing a more consistent plasma density over the substrate, thereby resulting in a more uniform deposition on the substrate to produce a film with improved thickness uniformity.

A skilled practitioner in the art will understand the need to modify the two step deposition process while retaining the basic nature of the process for performance of the invention with respect to time, chamber pressure, temperature, and with variable equipment.

Example of the Two Step Deposition

An aluminum nitride layer was deposited according the invention as follows. A substrate was introduced into the processing platform (e.g., the Eudura® Platform available from Applied Materials of Santa Clara, Calif.) and transferred to a PVD chamber. Nitrogen was introduced at a rate of about 56 sccm and argon was introduced into the chamber at a flow rate of about 9 sccm for a period of about 60 seconds until the chamber pressure was stabilized at about 3.1 milliTorr. A plasma was struck and aluminum was sputtered from the aluminum target in the nitrogen/argon plasma. The target was sputtered for about 15 seconds at a power of about 4 kW to produce an aluminum nitride layer with a thickness of less than about 300Å.

A second aluminum nitride layer was then deposited over the first aluminum nitride layer. Nitrogen and argon were flowed into the chamber at a flow rate of about 56 sccm for nitrogen and about 144 sccm for argon to achieve a chamber pressure of about 9.1 milliTorr. The gas was introduced for a period of about 10 seconds before a plasma was struck. Aluminum was sputtered from the aluminum target in the nitrogen and argon plasma. The sputtering of the target occurred for approximately 695 seconds at about 4 kW of power. The substrate was removed and tested for stress, thickness uniformity of the layer, and crystal orientation. The results are listed in Table I below.

Comparison Examples of One Step Depositions

An aluminum nitride film was deposited at a low chamber pressure under the conditions reflecting the first aluminum nitride deposition step described above. Another aluminum nitride film was deposited at the high chamber pressure conditions described above for the second deposition step. The deposited aluminum nitride layers were then tested for layer thickness uniformity, film stress, thickness uniformity of the film, and crystal orientation of the deposited aluminum nitride.

The low pressure aluminum nitride deposition was performed by introducing a first substrate into a PVD chamber. Once the substrate was disposed inside the chamber, nitrogen gas at a flow rate of about 30 sccm and an argon gas at a flow rate of about 9 sccm were introduced into the chamber for about 60 seconds to provide a chamber pressure of about 2.0 milliTorr prior to striking a plasma. Aluminum was sputtered from the aluminum target in the nitrogen plasma to deposited a layer of aluminum nitride for about 710 seconds at about 4 kW.

The high pressure aluminum nitride deposition was performed by introducing a second substrate into a PVD chamber. Once the substrate was introduced into the chamber, nitrogen and argon were introduced at a flow rate of 56 sccm and 144 sccm, respectfully, for about 60 seconds until a chamber pressure of about 9.1 milliTorr was established prior to striking a plasma. Once a plasma was struck, the aluminum target was sputtered in the nitrogen plasma to deposit a layer of aluminum nitride, wherein the layer was deposited for approximately 710 seconds at about 4 kW.

Table I below summarizes the information from the two step deposition process and the two one step comparison tests.

TABLE I

Summary of Two step Aluminum Nitride PVD Deposition and Comparison Examples.

| Parameter | Two Step Low/High Pressure Dep. | One Step Low Pressure Deposition | One Step High Pressure Deposition |
|---|---|---|---|
| Process Information: | | | |
| Nitrogen ($N_2$), sccm | 56/56 | 30 | 56 |
| Argon (Ar), sccm | 9/144 | 9 | 144 |
| Dep. Pressure (milliTorr) | 3.1/9.1 | 2 | 9.1 |
| Results: | | | |
| XRD counts of AlN (0002) peak | 428k | 142k | 39k |
| FWHN (degrees) of AlN (0002) rocking curve | 1,157 | 1,313 | 2,186 |
| Deposition Rate (Å/min) | 1024 | 839 | 1032 |
| Non-Uniformity (49 points, 1 sigma %) | 1.84 | 2.43 | 2.08 |
| Stress ($10^9$ dynes/cm2) | 8 | −16 | 5.44 |

Table I indicates several important aspects of the two step deposition of the invention in comparison with a low pressure one step deposition process and a high pressure one step deposition process.

The X-Ray Diffraction (XRD) counts of the (0002) peak determine the amount of crystals formed with the (0002) orientation, where the larger the counts of the peak, the greater the amount of crystals that are formed with the (0002) orientation. As shown in Table 1, the high XRD counts of the (0002) peak indicates that a greater amount of crystals are formed with the (0002) orientation in the two step deposition process than in either the low or high pressure deposition process. This indicates that the first aluminum nitride deposition step provides a crystalline structure that aligns the subsequently deposited bulk aluminum nitride film in the second aluminum nitride deposition step of the two step deposition process.

The rocking curve data indicates the relative amounts of crystalline structures having (0002) orientations in comparison to crystalline structures having other crystalline orientations. Specifically, the smaller or narrower the full width half magnitude (FHWM) degree of the rocking curve, the greater the preferred degree of (0002) orientation of the film. Specifically, the two step deposition process of the invention has a degree of (0002) crystal orientation greater than the low pressure deposition step. This indicates that the film deposited by the two-step deposition process provides a highly oriented (0002) crystalline film. Since a preferred crystal orientation of an aluminum nitride film is essential in providing good electromechanical properties in SAW and BAW devices, the high XRD counts and the narrow rocking curve data from Table 1 shows the deposition process according to the invention provides high crystalline quality films.

Table I further exemplifies the advantages of the present invention over the one step low pressure or the one step high pressure deposition. While providing superior crystalline quality films as shown above, the two step deposition process also provides commercially acceptable deposition rates (i.e., >1000 Å/min). The deposition rate of the two-step deposition process is comparable to the deposition rate of the high pressure aluminum nitride scheme. Further, the overall stress of the (0002) orientated film produced according to the invention is significantly less than the (0002) orientated film deposited in the one step low pressure aluminum nitride deposition process. Thus, the present invention also produces high quality (0002) films having low film stresses (i.e. about $8 \times 10^9$ dynes/cm), which results in less layering defects during deposition. Finally, the invention also provides an improved layer thickness uniformity as compared to the one step depositions. The improved layer thickness uniformity provides good electromechanical properties and consistent performance of the film in SAW devices.

While foregoing is directed to the preferred embodiment of the present invention, other and further embodiments of the invention may be devised without departing from the basic scope thereof, and the scope thereof is determined by the claims that follow.

What is claimed is:

1. A method of forming an aluminum nitride layer on a substrate in a processing chamber comprising:
    a. maintaining a first chamber pressure for a first period of time and depositing a first aluminum nitride layer at the first chamber pressure to form a nucleation film with a 0002 crystal orientation; and
    b. maintaining a second chamber pressure higher than the first chamber pressure for a second period of time and depositing a second aluminum nitride layer at the second chamber pressure.

2. The method of claim 1, wherein the first chamber pressure is maintained at a chamber pressure between about 1.5 milliTorr and about 3 milliTorr.

3. The method of claim 1, wherein the second chamber pressure is maintained at a chamber pressure between about 5 milliTorr and about 10 milliTorr.

4. The method of claim 1, wherein the first and second aluminum nitride layers are deposited sequentially in the same processing chamber.

5. The method of claim 1, wherein depositing the first aluminum nitride layer comprises sputtering an aluminum target in a first plasma comprising nitrogen and an inert gas and depositing the second aluminum nitride layer comprises sputtering an aluminum target in a second plasma comprising nitrogen and an inert gas.

6. The method of claim 5, wherein the first plasma and the second plasma are generated by supplying power between about 4000 watts and about 7000 watts to a target disposed in the processing chamber.

7. The method of claim 1, wherein sputtering the aluminum target comprises generating a first plasma to deposit the first aluminum nitride layer and generating a second plasma to deposit the second aluminum nitride layer.

8. A method of processing a substrate in a processing chamber, comprising:
    a. introducing a first nitrating process gas into the processing chamber at a first chamber pressure;
    b. generating a first plasma in the processing chamber and sputtering an aluminum target to deposit a first aluminum nitride layer;
    c. introducing a second nitrating process gas into the processing chamber at a second chamber pressure higher than the first chamber pressure; and
    d. generating a second plasma in the processing chamber and sputtering an aluminum target to deposit a second aluminum nitride layer.

9. The method of claim 8, wherein the first chamber pressure is between about 1.5 milliTorr and about 3 milliTorr.

10. The method of claim 8, wherein the first nitrating gas and the second nitrating gas comprise nitrogen and an inert gas.

11. The method of claim 8, wherein the second chamber pressure is between about 5 mlliliTorr and about 10 milliTorr.

12. The method of claim 8, wherein the first and second aluminum nitride layers are deposited sequentially in the same processing chamber.

13. The method of claim 8, wherein the first plasma and second plasma are generated by supplying a power of between about 4000 watts and about 7000 watts to the aluminum target.

14. The method of claim 8, wherein the substrate is maintained at a temperature between about 125° C. and about 500° C.

15. A method of forming an aluminum nitride layer on a substrate in a processing chamber comprising:

a. depositing a first aluminum nitride layer by sputtering an aluminum target in a first nitrogen and inert gas plasma at a first chamber pressure maintained between about 1.5 milliTorr and about 3 milliTorr for a first period of time; and b. depositing a second aluminum nitride layer by sputtering the aluminum target in a second nitrogen and inert gas plasma at a second chamber pressure maintained between about 5 milliTorr and about 10 milliTorr for a second period of time.

16. The method of claim 15, wherein the first aluminum nitride layer nucleates the deposition of the second aluminum nitride layer.

17. The method of claim 15, wherein the substrate is maintained at a temperature between about 125° C. and about 500° C.

18. The method of claim 15, wherein sputtering the aluminum target in the first nitrogen and inert gas plasma comprises generating a plasma by supplying power between about 4000 watts and about 7000 watts to the aluminum target disposed in the processing chamber.

19. The method of claim 15, wherein sputtering the aluminum target in the second nitrogen and inert gas plasma comprises generating a plasma by supplying power between about 4000 watts and about 7000 watts to the aluminum target disposed in the processing chamber.

* * * * *